United States Patent
Ryu et al.

(10) Patent No.: US 9,245,779 B2
(45) Date of Patent: Jan. 26, 2016

(54) METHOD OF PREPARING THIN FILM, THIN FILM, APPARATUS FOR PREPARING THIN FILM, AND ELECTRONIC DEVICE INCLUDING THIN FILM

(75) Inventors: Myung-kwan Ryu, Yongin-si (KR); Jong-baek Seon, Yongin-si (KR); Sang-yoon Lee, Seoul (KR)

(73) Assignees: Samsung Electronics Co., Ltd., Gyeonggi-do (KR); Samsung Display Co., Ltd., Gyeonggi-do (KR)

( * ) Notice: Subject to any disclaimer, the term of this patent is extended or adjusted under 35 U.S.C. 154(b) by 411 days.

(21) Appl. No.: 13/565,943

(22) Filed: Aug. 3, 2012

(65) Prior Publication Data
US 2013/0034708 A1    Feb. 7, 2013

(30) Foreign Application Priority Data

Aug. 5, 2011    (KR) .................. 10-2011-0078206

(51) Int. Cl.
*B05D 3/02*    (2006.01)
*H01L 21/67*    (2006.01)

(52) U.S. Cl.
CPC ...... *H01L 21/6715* (2013.01); *H01L 21/67098* (2013.01); *Y10T 428/24942* (2015.01); *Y10T 428/265* (2015.01)

(58) Field of Classification Search
USPC .................................................. 427/376.2
See application file for complete search history.

(56) References Cited

U.S. PATENT DOCUMENTS

| | | | |
|---|---|---|---|
| 4,874,522 A | 10/1989 | Okamoto et al. | |
| 5,447,812 A * | 9/1995 | Fukuda et al. | 430/66 |
| 2003/0157250 A1* | 8/2003 | Mukherjee et al. | 427/337 |
| 2007/0184576 A1* | 8/2007 | Chang | C23C 18/06 438/104 |
| 2010/0282128 A1 | 11/2010 | Blumel et al. | |

FOREIGN PATENT DOCUMENTS

| | | |
|---|---|---|
| JP | 2005-186353 A | 7/2005 |
| JP | 2007-251086 A | 9/2007 |
| KR | 20070044145 A | 4/2007 |
| KR | 20090102899 A | 10/2009 |
| KR | 100960808 B1 | 5/2010 |
| KR | 20100097789 A | 9/2010 |
| KR | 20110007681 A | 1/2011 |
| KR | 101089566 B1 | 12/2011 |

OTHER PUBLICATIONS

Lu et al "Preparation and Optical Properties of Phase-change VO2 Thin Films" Journal of Materials Science 28 (1993) pp. 2169-2177.*
Stoica et al "Properties of High-Porosity Sol-gel Derived Indium-Tin Oxide Films" J. Optoelect. Adv. Mat. vol. 7 No. 5, Oct. 2005, p. 2353-2358.*

(Continued)

*Primary Examiner* — Nathan Empie
(74) *Attorney, Agent, or Firm* — Harness, Dickey & Pierce, P.L.C.

(57) ABSTRACT

A method of preparing a thin film includes coating a thin film-forming composition on a substrate, and heat-treating the coated thin film-forming composition under a pressure less than 760 Torr. The thin film includes a compact layer having a thickness in a range of greater than 50 Å to about 20,000 Å and a refractive index in a range of about 1.85 to about 2.0.

5 Claims, 5 Drawing Sheets

(56) References Cited

OTHER PUBLICATIONS

Sreemany et al "Influence of Calcination Ambient and Film Thickness on the Optical and Structural Properties of Sol-gel TiO2 Thin Films" Materials Research Bulletin 42 (2007) 177-189.*

I. Ichinose, et al., "A Surface Sol-Gel Process of $TiO_2$ and Other Metal Oxide Films with Molecular Precision," *Chem Mater.*, vol. 9, pp. 1296-1298 (1997).

Y. Aoki, et al., "Solution-based Fabrication of High-$_K$ Gate Dielectrics for Next-Generation Metal-Oxide Semiconductor Transistors," *Adv. Mater.*, vol. 16, No. 2, pp. 118-123 (Jan. 16, 2004).

Yoshitaka Aoki, et al. "Sol-Gel Fabrication of Dielectric HfO2 Nano-Films; Formation of Uniform, Void-Free Layers and Their Superior Electrical Properties" Chem. Mater. 17, 450 (2005).

\* cited by examiner (a)

(b)

(c)

METHOD OF PREPARING THIN FILM, THIN FILM, APPARATUS FOR PREPARING THIN FILM, AND ELECTRONIC DEVICE INCLUDING THIN FILM

CROSS-REFERENCE TO RELATED APPLICATIONS

This application claims the benefit of Korean Patent Application No. 10-2011-0078206, filed on Aug. 5, 2011, in the Korean Intellectual Property Office, the disclosure of which is incorporated herein in its entirety by reference.

BACKGROUND

1. Field

Some example embodiments relate to methods of preparing thin films, thin films, apparatuses for preparing the thin films, and/or electronic devices including the thin films, and more particularly, to methods of preparing thin films that include heat treating a thin film-forming composition under reduced pressure, thin films, apparatuses for preparing the thin films, and/or electronic devices including the thin films.

2. Description of the Related Art

Electronic devices such as resistors, capacitors, diodes, thin film transistors (TFTs), and the like are used in various applications. In particular, TFTs are used as a switching and driving device in flat panel display devices such as liquid crystal displays (LCDs), organic light-emitting diode (OLED) display devices, electrophoretic displays, and the like.

These electronic devices include semiconductor thin films, which may be generally formed using a method, e.g., chemical vapor deposition. However, such a deposition method incurs high manufacturing costs and has complicated processes.

SUMMARY

Some example embodiments provide methods of preparing thin films that include heat treating a thin film-forming composition under reduced pressure. Other example embodiments provide thin films having a relatively large thickness and a relatively high refractive index. Other example embodiments provide apparatuses for preparing the thin films. Other example embodiments provide electronic devices including the thin films.

Additional aspects will be set forth in part in the description which follows and, in part, will be apparent from the description, or may be learned by practice of the presented embodiments.

According to an example embodiment, a method of preparing a thin film includes coating a thin film-forming composition on a substrate, and heat-treating the coated thin film-forming composition under a pressure less than 760 Torr.

The coating may be performed by one of inkjet printing, spin coating, slit coating, spraying, immersion, a roll-to-roll method, and nanoimprinting. The heat-treating may be performed at a pressure in a range of about $1\times10^{-6}$ Torr to less than 760 Torr and at a temperature in a range of about 250° C. to about 450° C. The thin film-forming composition may comprise a metal oxide precursor, a sol stabilizer, and a solvent.

The metal oxide precursor may comprise at least two selected from the group consisting of a zinc compound, an indium compound, a hafnium compound, a gallium compound, a titanium compound, a zirconium compound, an aluminum compound, a silicon compound, a germanium compound, a tin compound, a magnesium compound, a yttrium compound, a vanadium compound, a lithium compound, a cerium compound, a calcium compound, a potassium compound, a scandium compound, a tantalum compound, a tungsten compound, a copper compound, a molybdenum compound, a ruthenium compound, an antimony compound, a tellurium compound, an iodine compound, an iridium compound, a lead compound, and a bismuth compound.

The thin film-forming composition may include one of a solvent having a lower boiling point to increase a thickness of a compact layer of the thin film and a solvent having a higher boiling point to reduce the thickness of the compact layer, the compact layer having a refractive index in the range of about 1.85 to about 2.0.

According to another example embodiment, a thin film prepared using the method described above includes a compact layer having a thickness in a range of greater than 50 Å to about 20,000 Å and a refractive index in a range of about 1.85 to about 2.0.

The thin film may further include a porous layer having a refractive index less than 1.85. The thin film may include one of an oxide semiconductor thin film, an insulator thin film, and a metal thin film.

According to another example embodiment, an apparatus for preparing a thin film includes a coating unit configured to coat a thin film-forming composition on a substrate, and a reduced pressure heat treatment unit configured to form a thin film on the substrate with the coated thin film-forming composition.

The apparatus may further include a buffer unit configured to perform at least one of a preheating process of the substrate passed through the coating unit and a cooling process of the thin film formed in the reduced pressure heat treatment unit. The coating unit may include at least one of a substrate-heating member and a pressure reducing member.

According to another example embodiment, an electronic device may include the above-described thin film.

The electronic device may include one of a thin film transistor, a liquid crystal display device, an organic light-emitting diode display device, an electrophoretic display device, a memory device, a solar cell device, and an optical film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
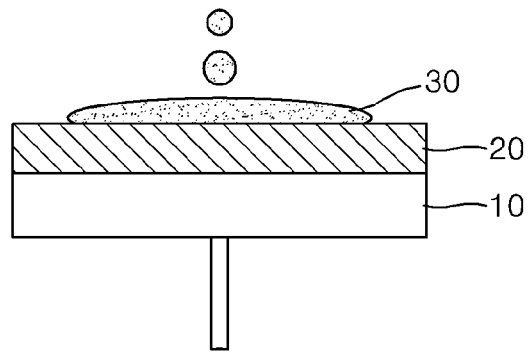
FIGS. 1(a)-1(c) illustrate cross-sectional views for explaining a method of preparing a thin film, according to an example embodiment.
Figure 1:
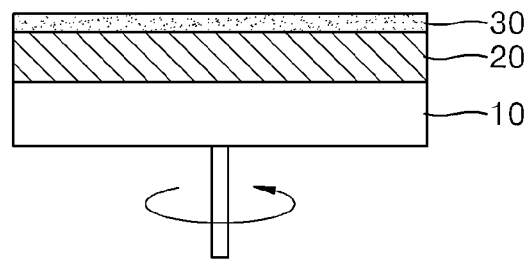
Figure 1:
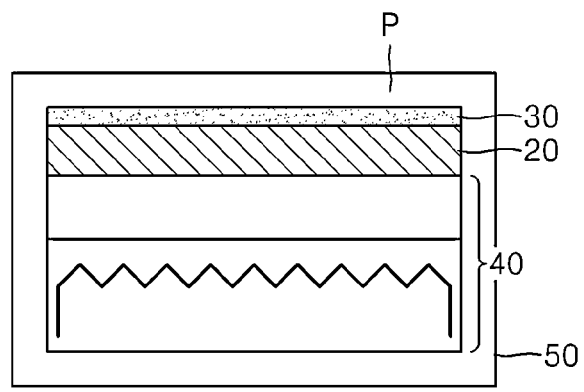

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments of a method of preparing a thin film, a thin film prepared using the preparation method, an apparatus for preparing the thin film, and an electronic device including the thin film will be described in detail with reference to the accompanying drawings.

According to an example embodiment, a method of preparing a thin film includes coating a thin film-forming composition on a substrate and heat treating the coated thin film-forming composition under reduced pressure.

The thin film-forming composition may include a metal oxide precursor, a sol stabilizer, and a solvent.

The metal oxide precursor may include, but is not limited to, at least two selected from the group consisting of a zinc compound, an indium compound, a hafnium compound, a gallium compound, a titanium compound, a zirconium compound, an aluminum compound, a silicon compound, a germanium compound, a tin compound, a magnesium compound, a yttrium compound, a vanadium compound, a lithium compound, a cerium compound, a calcium compound, a potassium compound, a scandium compound, a tantalum compound, a tungsten compound, a copper compound, a molybdenum compound, a ruthenium compound, an antimony compound, a tellurium compound, an iodine compound, an iridium compound, a lead compound, and a bismuth compound.

Examples of the zinc compound may include, but are not limited to, zinc acetate, zinc nitrate, zinc halide (e.g., zinc fluoride), zinc citrate, zinc (metha)acrylate, zinc acetylacetonate, zinc thiocarbamate, zinc hydroxide, zinc alkoxide, zinc carbonate, zinc sulfonate, zinc undecylate, zinc phosphate, zinc borate, and hydrates thereof.

Examples of the indium compound may include, but are not limited to, indium acetate, indium nitrate, indium halide (e.g., indium fluoride), indium citrate, indium (metha)acrylate, indium acetylacetonate, indium thiocarbamate, indium hydroxide, indium alkoxide, indium carbonate, indium sulfonate, indium undecylate, indium phosphate, indium borate, and hydrates thereof.

Examples of the hafnium compound may include, but are not limited to, hafnium acetate, hafnium nitrate, hafnium halide (e.g., hafnium fluoride), hafnium citrate, hafnium (metha)acrylate, hafnium acetylacetonate, hafnium thiocarbamate, hafnium hydroxide, hafnium alkoxide, hafnium carbonate, hafnium sulfonate, hafnium undecylate, hafnium phosphate, hafnium borate, and hydrates thereof.

Examples of the gallium compound may include, but are not limited to, gallium acetate, gallium nitrate, gallium halide (e.g., gallium fluoride), gallium citrate, gallium (metha)acrylate, gallium acetylacetonate, gallium thiocarbamate, gallium hydroxide, gallium alkoxide, gallium carbonate, gallium phosphate, gallium borate, and hydrates thereof.

Examples of the titanium compound may include, but are not limited to, titanium acetate, titanium nitrate, titanium halide (e.g., titanium fluoride), titanium citrate, titanium (metha)acrylate, titanium acetylacetonate, titanium thiocarbamate, titanium hydroxide, titanium alkoxide, titanium carbonate, titanium phosphate, titanium borate, and hydrates thereof.

Examples of the zirconium compound may include, but are not limited to, zirconium acetate, zirconium nitrate, zirconium halide, zirconium citrate, zirconium (metha)acrylate, zirconium acetylacetonate, zirconium thiocarbamate, zirconium hydroxide, zirconium alkoxide, zirconium carbonate, zirconium phosphate, zirconium borate, and hydrates thereof.

Examples of the aluminum compound may include, but are not limited to, aluminum acetate, aluminum nitrate, aluminum halide (e.g., aluminum fluoride), aluminum citrate, aluminum (metha)acrylate, aluminum acetylacetonate, aluminum thiocarbamate, aluminum hydroxide, aluminum alkoxide, aluminum carbonate, aluminum phosphate, aluminum borate, and hydrates thereof.

Examples of the silicon compound may include, but are not limited to, silicon acetate, silicon nitrate, silicon halide (e.g., silicon fluoride), silicon citrate, silicon (metha)acrylate, silicon acetylacetonate, silicon thiocarbamate, silicon hydroxide, silicon alkoxide, silicon carbonate, silicon phosphate, silicon borate, and hydrates thereof.

Examples of the germanium compound may include, but are not limited to, germanium acetate, germanium nitrate, germanium halide (e.g., germanium fluoride), germanium citrate, germanium (metha)acrylate, germanium acetylacetonate, germanium thiocarbamate, germanium hydroxide, germanium alkoxide, germanium carbonate, germanium phosphate, germanium borate, and hydrates thereof.

Examples of the tin compound may include, but are not limited to, tin acetate, tin nitrate, tin halide (e.g., tin fluoride), tin citrate, tin (metha)acrylate, tin acetylacetonate, tin thiocarbamate, tin hydroxide, tin alkoxide, tin carbonate, tin phosphate, tin borate, and hydrates thereof.

Examples of the magnesium compound may include, but are not limited to, magnesium acetate, magnesium nitrate, magnesium halide (e.g., magnesium fluoride), magnesium citrate, magnesium (metha)acrylate, magnesium acetylacetonate, magnesium thiocarbamate, magnesium hydroxide, magnesium alkoxide, magnesium carbonate, magnesium phosphate, magnesium borate, and hydrates thereof.

Examples of the yttrium compound may include, but are not limited to, yttrium acetate, yttrium nitrate, yttrium halide (e.g., yttrium fluoride), yttrium citrate, yttrium (metha)acrylate, yttrium acetylacetonate, yttrium thiocarbamate, yttrium hydroxide, yttrium alkoxide, yttrium carbonate, yttrium phosphate, yttrium borate, and hydrates thereof.

Examples of the vanadium compound may include, but are not limited to, vanadium acetate, vanadium nitrate, vanadium halide (e.g., vanadium fluoride), vanadium citrate, vanadium (metha)acrylate, vanadium acetylacetonate, vanadium thiocarbamate, vanadium hydroxide, vanadium alkoxide, vanadium carbonate, vanadium phosphate, vanadium borate, and hydrates thereof.

Examples of the lithium compound may include, but are not limited to, lithium acetate, lithium nitrate, lithium halide (e.g., lithium fluoride), lithium citrate, lithium (metha)acrylate, lithium acetylacetonate, lithium thiocarbamate, lithium hydroxide, lithium alkoxide, lithium carbonate, lithium phosphate, lithium borate, and hydrates thereof.

Examples of the cerium compound may include, but are not limited to, cerium acetate, cerium nitrate, cerium halide (e.g., cerium fluoride), cerium citrate, cerium (metha)acrylate, cerium acetylacetonate, cerium thiocarbamate, cerium hydroxide, cerium alkoxide, cerium carbonate, cerium phosphate, cerium borate, and hydrates thereof.

Examples of the calcium compound may include, but are not limited to, calcium acetate, calcium nitrate, calcium halide (e.g., calcium fluoride), calcium citrate, calcium (metha)acrylate, calcium acetylacetonate, calcium thiocarbamate, calcium hydroxide, calcium alkoxide, calcium carbonate, calcium phosphate, calcium borate, and hydrates thereof.

Examples of the potassium compound may include, but are not limited to, potassium acetate, potassium nitrate, potassium halide (e.g., potassium fluoride), potassium citrate, potassium (metha)acrylate, potassium acetylacetonate, potassium thiocarbamate, potassium hydroxide, potassium alkoxide, potassium carbonate, potassium phosphate, potassium borate, and hydrates thereof.

Examples of the scandium compound may include, but are not limited to, scandium acetate, scandium nitrate, scandium halide (e.g., scandium fluoride), scandium citrate, scandium (metha)acrylate, scandium acetylacetonate, scandium thiocarbamate, scandium hydroxide, scandium alkoxide, scandium carbonate, scandium phosphate, scandium borate, and hydrates thereof.

Examples of the tantalum compound may include, but are not limited to, tantalum acetate, tantalum nitrate, tantalum halide (e.g., tantalum fluoride), tantalum citrate, tantalum (metha)acrylate, tantalum acetylacetonate, tantalum thiocarbamate, tantalum hydroxide, tantalum alkoxide, tantalum carbonate, tantalum phosphate, tantalum borate, and hydrates thereof.

Examples of the tungsten compound may include, but are not limited to, tungsten acetate, tungsten nitrate, tungsten halide (e.g., tungsten fluoride), tungsten citrate, tungsten (metha)acrylate, tungsten acetylacetonate, tungsten thiocarbamate, tungsten hydroxide, tungsten alkoxide, tungsten carbonate, tungsten phosphate, tungsten borate, and hydrates thereof.

Examples of the copper compound may include, but are not limited to, copper acetate, copper nitrate, copper halide (e.g., copper fluoride), copper citrate, copper (metha)acrylate, copper acetylacetonate, copper thiocarbamate, copper hydroxide, copper alkoxide, copper carbonate, copper phosphate, copper borate, and hydrates thereof.

Examples of the molybdenum compound may include, but are not limited to, molybdenum acetate, molybdenum nitrate, molybdenum halide (e.g., molybdenum fluoride), molybdenum citrate, molybdenum (metha)acrylate, molybdenum acetylacetonate, molybdenum thiocarbamate, molybdenum hydroxide, molybdenum alkoxide, molybdenum carbonate, molybdenum phosphate, molybdenum borate, and hydrates thereof.

Examples of the ruthenium compound may include, but are not limited to, ruthenium acetate, ruthenium nitrate, ruthenium halide (e.g., ruthenium fluoride), ruthenium citrate, ruthenium (metha)acrylate, ruthenium acetylacetonate, ruthenium thiocarbamate, ruthenium hydroxide, ruthenium alkoxide, ruthenium carbonate, ruthenium phosphate, ruthenium borate, and hydrates thereof.

Examples of the antimony compound may include, but are not limited to, antimony acetate, antimony nitrate, antimony halide (e.g., antimony fluoride), antimony citrate, antimony (metha)acrylate, antimony acetylacetonate, antimony thiocarbamate, antimony hydroxide, antimony alkoxide, antimony carbonate, antimony phosphate, antimony borate, and hydrates thereof.

Examples of the tellurium compound may include, but are not limited to, tellurium acetate, tellurium nitrate, tellurium halide (e.g., tellurium fluoride), tellurium citrate, tellurium (metha)acrylate, tellurium acetylacetonate, tellurium thiocarbamate, tellurium hydroxide, tellurium alkoxide, tellurium carbonate, tellurium phosphate, tellurium borate, and hydrates thereof.

Examples of the iodine compound may include, but are not limited to, iodine acetate, iodine nitrate, iodine halide (e.g., iodine fluoride), iodine citrate, iodine (metha)acrylate, iodine acetylacetonate, iodine thiocarbamate, iodine hydroxide, iodine alkoxide, iodine carbonate, iodine phosphate, iodine borate, and hydrates thereof.

Examples of the iridium compound may include, but are not limited to, iridium acetate, iridium nitrate, iridium halide, iridium fluoride, iridium citrate, iridium (metha)acrylate, iridium acetylacetonate, iridium thiocarbamate, iridium hydroxide, iridium alkoxide, iridium carbonate, iridium phosphate, iridium borate, and hydrates thereof.

Examples of the lead compound may include, but are not limited to, lead acetate, lead nitrate, lead halide (e.g., lead fluoride), lead citrate, lead (metha)acrylate, lead acetylacetonate, lead thiocarbamate, lead hydroxide, lead alkoxide, lead carbonate, lead phosphate, lead borate, and hydrates thereof.

Examples of the bismuth compound may include, but are not limited to, bismuth acetate, bismuth nitrate, bismuth halide (e.g., bismuth fluoride), bismuth citrate, bismuth (metha)acrylate, bismuth acetylacetonate, bismuth thiocarbamate, bismuth hydroxide, bismuth alkoxide, bismuth carbonate, bismuth phosphate, bismuth borate, and hydrates thereof.

The concentration of the metal oxide precursor in the thin film-forming composition may be in the range of about 0.01 M to about 10 M, for example, in the range of about 0.05 M to about 10 M, for example, in the range of about 0.1 M to about 10 M.

The sol stabilizer may be, but is not limited to, an alcohol amine compound, a ketone compound, an acid compound, or combinations thereof.

The alcohol amine compound may be one selected from, but is not limited to, monoethanolamine, diethanolamine, triethanolamine, monoisopropylamine, N,N-methylethanolamine, and aminoethyl ethanolamine.

The ketone compound may be one selected from the group consisting of, but is not limited to, the group consisting of acetylacetone, acetylacetonate, and acetate.

The acid compound may be one selected from, but is not limited to, the group consisting of acetic acid, hydrofluoric acid (HF), hydroiodic acid (HI), hydrochloric acid, nitric acid, and sulfuric acid.

The sol stabilizer is included in the thin film-forming composition to increase the solubility of the other constituents included therein, and thus, a uniform thin film may be formed. The amount of the sol stabilizer may vary according to the types and amounts of the other constituents described above. For example, the amount of the sol stabilizer may be in the range of about 0.01 to about 30 wt % based on a total amount of the thin film-forming composition. When the amount of the sol stabilizer is within this range, the solubility of the other constituents and the coating performance of the thin film-forming composition may be enhanced.

Examples of the solvent may include, but are not limited to, dichloromethane, chloroform, tetrahydrofuran, propyl bromide, carbon tetrachloride, ethyl acetate, methyl propionate, benzene, methyl n-butyrate, toluene, 1,1,2-trichloroethane, methyl isobutyl ketone, tetrachloroethylene, m-xylene, styrene, methanol, ethanol, propanol, isopropanol, 2-methoxyethanol, 2-ethoxyethanol, 2-propoxyethanol, 2-butoxyethanol, methyl cellosolve, ethyl cellosolve, diethylene glycol methyl ether, diethylene glycol ethyl ether, dipropylene glycol methyl ether, hexane, heptane, octane, butyl acetate, diethylene glycol dimethyl ether, diethylene glycol dimethyl ethyl ether, methyl methoxypropionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone, γ-butyrolactone, diethyl ether, ethylene glycol dimethyl ether, diglyme, acetylacetone, and acetonitrile.

The thin film-forming composition may further include a thickener such as glycerol. The substrate may be, but is not limited to, a glass substrate, a plastic substrate, a silicon substrate, a synthetic resin substrate, or a gate insulating layer of a thin film transistor.

The coating process may be performed by inkjet printing, spin coating, slit coating, spraying, immersion, a roll-to-roll method, or nanoimprinting.

The heat treatment process under reduced pressure may be performed at a temperature in the range of about 150 to about 600° C. at vacuum pressure or a pressure that is lower than a partial pressure or an equilibrium partial pressure of the solvent in an ambient atmosphere. For example, the heat treatment process under reduced pressure may be performed at a pressure in the range of $1 \times 10^{-6}$ Torr to less than 760 Torr at a temperature in the range of about 150 to about 600° C. The thin film-forming composition coated on the substrate is heat treated under reduced pressure, thereby obtaining a thin film including a thick compact layer, which will be described below. The term "compact layer" used herein refers to a layer having a high refractive index n (e.g., n≥1.85).

FIGS. 1(a)-1(c) illustrate cross-sectional views for explaining a method of preparing a thin film, according to an example embodiment. Hereinafter, a method of forming a thin film by spin coating will be described in detail with reference to FIGS. 1(a)-1(c).

First, referring to FIG. 1(a), a substrate 20 is positioned on a coater 10, and a thin film-forming composition 30 is dropped on the substrate 20. The substrate 20 may be previously washed and surface-treated.

Subsequently, referring to FIG. 1(b), the coater 10 is spun at about 500 to about 5000 rpm to widely spread the thin film-forming composition 30 on the substrate 20. This process may be performed under reduced pressure and heat.

Next, referring to FIG. 1(c), the substrate 20 on which the thin film-forming composition 30 is coated is mounted on a heat plate 40 positioned in a vacuum chamber 50. Subsequently, the vacuum chamber 50 is vacuum pumped until an internal pressure P reaches a given (or, alternatively predetermined) pressure (e.g., a pressure of about 1×10-6 Torr to less than 760 Torr), and the heat plate 40 is then heated at a temperature of about 250 to about 450° C., thereby removing the solvent included in the thin film-forming composition 30. As a result, a thin film including a relatively thick compact layer is obtained. Alternatively, the heat treatment process under reduced pressure may be performed without using a heat plate in a vacuum furnace including an internal heating member or in a microwave heater including an internal pressure-reducing member.

Figure 2:
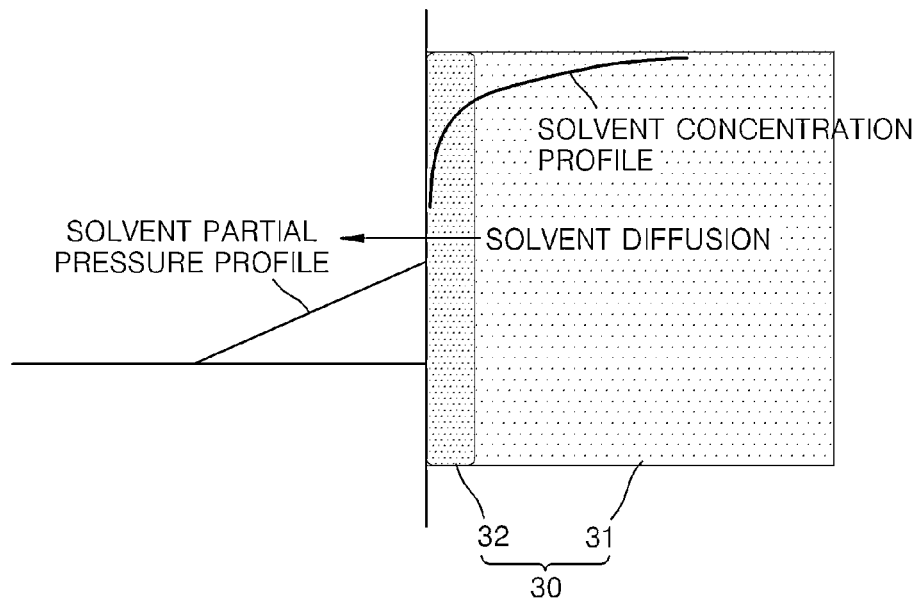
FIG. 2 is a diagram for explaining a principle of a method of preparing a thin film, according to an example embodiment.

FIG. 2 is a diagram for explaining a principle of a method of preparing a thin film, according to an example embodiment. Referring to FIG. 2, in the heat treatment process under reduced pressure, the solvent in the thin film-forming composition 30 is removed by evaporation. The evaporation of the solvent firstly occurs on a surface of the thin film-forming composition 30 and after the solvent on a surface has evaporated, the solvent inside the thin film-forming composition 30 is diffused onto the surface thereof to evaporate. Thus, while the heat treatment process under reduced pressure is performed, the thin film-forming composition 30 has a solvent concentration profile as illustrated in FIG. 2.

In addition, as the heat treatment process under reduced pressure proceeds, the thin film-forming composition 30 is divided into an internal composition portion 31 and a surface compact layer-forming portion 32. In this regard, the internal composition portion 31 refers to a portion having a higher concentration of the solvent than that of the solvent in the surface compact layer-forming portion 32. The solvent that evaporated from the surface of the thin film-forming composition 30 is rapidly discharged to the external environment (e.g., outside the vacuum chamber 50 of FIG. 1(c)) due to reduced pressure atmosphere. Thus, an evaporation rate of the solvent from the surface of the thin film-forming composition 30 (hereinafter, referred to as surface solvent evaporation rate) becomes relatively fast. A solvent partial pressure profile in this state is illustrated in FIG. 2.

The thickness of the compact layer is determined by the surface solvent evaporation rate. For example, as the surface solvent evaporation rate increases, the thickness of the compact layer increases.

In addition, as a pressure P of a heat treatment atmosphere decreases, a heat treatment temperature T increases, and a boiling point of the solvent decreases (i.e., as a vapor pressure of the solvent increases), the surface solvent evaporation rate increases. Thus, the surface solvent evaporation rate is adjustable by appropriately adjusting the heat treatment pressure P, the heat treatment temperature T, and the boiling point of the solvent, whereby the thickness of the compact layer may be adjusted. In other words, the thickness of the compact layer may be increased using a solvent having a relatively high vapor pressure.

A thin film prepared using the preparation method of the thin film described above includes a compact layer having a thickness in the range of greater than 50 Å to about 1000 Å and a refractive index in the range of about 1.85 to about 2.0.

The thin film may have a hetero-structure including both the compact layer and a porous layer having a refractive index less than 1.85. The thin film may be an oxide semiconductor thin film, an insulator thin film, or a metal thin film for wiring.

Figure 3:
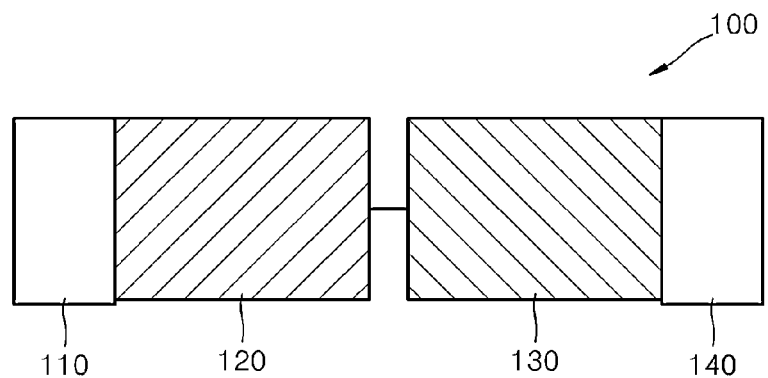
FIG. 3 is a schematic diagram illustrating an apparatus for preparing a thin film, according to an example embodiment.

FIG. 3 is a schematic diagram illustrating an apparatus 100 for preparing a thin film, according to an example embodiment. Referring to FIG. 3, the apparatus 100 for preparing a thin film includes a washing unit 110, a coating unit 120, a reduced pressure heat treatment unit 130, and a buffer unit 140.

The washing unit 110 washes a substrate and performs a surface treatment thereon. The washing and surface treatment processes may be performed using at least one chemical selected from the group consisting of deionized water, hydrogen peroxide, hydrogen water, ozonated water, HF, diluted HF (DHF), nitric acid, sulfuric acid, hydrochloric acid, phosphoric acid, acetic acid, and alcohol (e.g., ethanol, methanol, isopropyl alcohol, and the like). In addition, to wash adsorbent organic materials or perform a surface modification of the substrate before or after the washing process performed using the chemical described above and the surface treatment, the substrate may be subjected to a treatment of ultrasonic waves, UV rays, ozone or plasma (e.g., oxygen, $N_2O$, Ar, or $N_2$).

The coating unit 120 coats the thin film-forming composition on a substrate. The coating unit 120 may include an inkjet printing device, a spin-coating device, a slit-coating device, a spraying device, an immersing device, a roll-to-roll device, or a nanoimprinting device. In addition, although not illustrated in FIG. 3, the coating unit 120 may include at least one of a substrate-heating member and a pressure reducing member therein.

The reduced pressure heat treatment unit 130 enables the thin film-forming composition coated on the substrate to be formed as a thin film. The reduced pressure heat treatment unit 130 includes a substrate-heating member and a pressure reducing member therein.

For example, the substrate-heating members included in the coating unit 120 and the reduced pressure heat treatment unit 130 may be a hot plate, a vacuum furnace, or an ultrasonic heater. For example, the pressure reducing members respectively included in the coating unit 120 and the reduced pressure heat treatment unit 130 may include a vacuum chamber, a pipe that communicates with the vacuum chamber, and a vacuum pump that communicates with the pipe.

The buffer unit 140 performs at least one of a preheating process of the substrate passed through the coating unit 120 and a cooling process of the thin film formed in the reduced pressure heat treatment unit 130. To perform this process, the buffer unit 140 includes at least one of a substrate-heating member such as a heat plate and a cooling member such as a cold plate.

An electronic device including the thin film described above may be a thin film transistor (TFT), a liquid crystal display (LCD) device, an organic light-emitting diode (OLED) display device, an electrophoretic display device, a memory device, a solar cell device, or an optical film.

Some example embodiments will now be described in more detail with reference to the following Examples. These Examples are for illustrative purposes only and are not intended to limit the scope of the inventive concepts.

PREPARATION EXAMPLES 1 TO 9

Preparation of Thin Film-forming Compositions

Indium nitrate ($In(NO_3)_3$) was mixed at a concentration of 0.05 M to 0.5 M with 2-methoxyethanol to prepare an indium nitrate solution. Similarly, zinc acetate dianhydride ($Zn(CH_3COO)_3.2H_2O$) was mixed at a concentration of 0.05 to 0.5 M with 2-methoxyethanol to prepare a zinc acetate dianhydride solution. Subsequently, the indium nitrate solution (hereinafter, referred to as In solution) and the zinc acetate dianhydride solution (hereinafter, referred to as Zn solution) were mixed at a volume ratio of 3:1 (In solution:Zn solution), and given (or, alternatively predetermined) amounts of monoethanolamine (MEA) and acetic acid (AC) were then added to the mixed solution to obtain a thin film-forming composition.

The concentrations of metal oxide precursors and amounts of MEA and AC in the thin film-forming compositions are shown in Table 1 below.

TABLE 1

|  | Concentration of indium nitrate in indium nitrate solution (M) | Concentration of zinc acetate dianhydride in zinc acetate dianhydride solution (M) | Amount of MEA (g) (per 20 ml of solution) | Amount of Ac (g) (per 20 ml of solution) | Concentration of metal oxide precursor in thin film-forming composition (M) |
|---|---|---|---|---|---|
| Preparation Example 1 | 0.05 | 0.05 | 0.25 | 0.5 | 0.05 |
| Preparation Example 2 | 0.2 | 0.2 | 1 | 2 | 0.2 |
| Preparation Example 3 | 0.2 | 0.2 | 1 | 2 | 0.2 |
| Preparation Example 4 | 0.5 | 0.5 | 2.5 | 5 | 0.5 |
| Preparation Example 5 | 0.05 | 0.05 | 0.25 | 0.5 | 0.05 |
| Preparation Example 6 | 0.05 | 0.05 | 0.25 | 0.5 | 0.05 |
| Preparation Example 7 | 0.05 | 0.05 | 0.25 | 0.5 | 0.05 |
| Preparation Example 8 | 0.2 | 0.2 | 1 | 2 | 0.2 |
| Preparation Example 9 | 0.5 | 0.5 | 2.5 | 5 | 0.5 |

Examples 1 to 4

Preparation of Thin Films

A glass substrate was mounted on a coater, and each of the thin film-forming compositions prepared according to Preparation Examples 1 through 4 was dropped on the glass substrate. Subsequently, the coater was spun at rates shown in Table 2 below to widely spread each thin film-forming composition on the glass substrate. Thereafter, the substrate with each thin film-forming composition coated thereon was placed on a heat plate in a vacuum chamber. Next, the vacuum chamber was vacuum pumped until the internal pressure reached 0.01 Torr, and after the vacuum pumping process was terminated, the heat plate was heated at 450° C. for 1 hour, thereby removing the solvent included in the thin film-forming composition. As a result, thin films having thicknesses shown in Table 2 below were obtained. In this regard, the thicknesses of the thin films were measured using a spectroscopic ellipsometer (available from J.A. Woollam, M-2000V).

TABLE 2

|  | Example 1 | Example 2 | Example 3 | Example 4 |
|---|---|---|---|---|
| Used composition | Preparation Example 1 | Preparation Example 2 | Preparation Example 3 | Preparation Example 4 |
| Spinning rate of coater (rpm) | 2000 | 2000 | 500 | 2000 |
| Thickness of thin film (Å) | 12.05 | 169.37 | 356.75 | 479.59 |

Comparative Examples 1 Through 5

Preparation of Thin Films

A glass substrate was mounted on a coater, and each of the thin film-forming compositions prepared according to Preparation Examples 5 through 9 was dropped on the glass substrate. Subsequently, the coater was spun at rates shown in Table 3 below to widely spread each thin film-forming composition on the glass substrate. Thereafter, the substrate with each thin film-forming composition coated thereon was placed on a heat plate under atmospheric pressure. Next, the heat plate was heated at 450° C. for 1 hour in an air atmosphere (1 atm), thereby removing the solvent included in the thin film-forming composition. As a result, thin films having thicknesses shown in Table 3 below were obtained.

TABLE 3

|  | Comp. Example 1 | Comp. Example 2 | Comp. Example 3 | Comp. Example 4 | Comp. Example 5 |
|---|---|---|---|---|---|
| Used composition | Prep. Example 5 | Prep. Example 6 | Prep. Example 7 | Prep. Example 8 | Prep. Example 9 |
| Spinning rate of coater (rpm) | 5000 | 2000 | 500 | 2000 | 1500 |
| Thickness of thin film (Å) | 22.614 | 32.022 | 62.628 | 153.65 | 443.73 |

Evaluation Example 1

Refractive Indexes of Thin Films

Refractive indexes of the thin films prepared according to Examples 1 through 4 and Comparative Examples 1 through 5 were measured at a wavelength (ë) of 633 nm by using a spectroscopic ellipsometer (available from J.A. Woollam, M-2000V), and the measurement results are shown in Table 4 below and FIG. 4. The thicknesses of the thin films shown in Tables 2 and 3 are shown again in Table 4 below.

TABLE 4

| | Refractive index of thin film (n) | Thickness of thin film (Å) |
|---|---|---|
| Example 1 | 1.889 | 12.05 |
| Example 2 | 1.8921 | 169.37 |
| Example 3 | 1.8902 | 356.75 |
| Example 4 | 1.8666 | 479.59 |
| Comparative Example 1 | 1.89164 | 22.614 |
| Comparative Example 2 | 1.90688 | 32.022 |
| Comparative Example 3 | 1.8983 | 62.628 |
| Comparative Example 4 | 1.83694 | 153.65 |
| Comparative Example 5 | 1.7349 | 443.73 |

Figure 4:
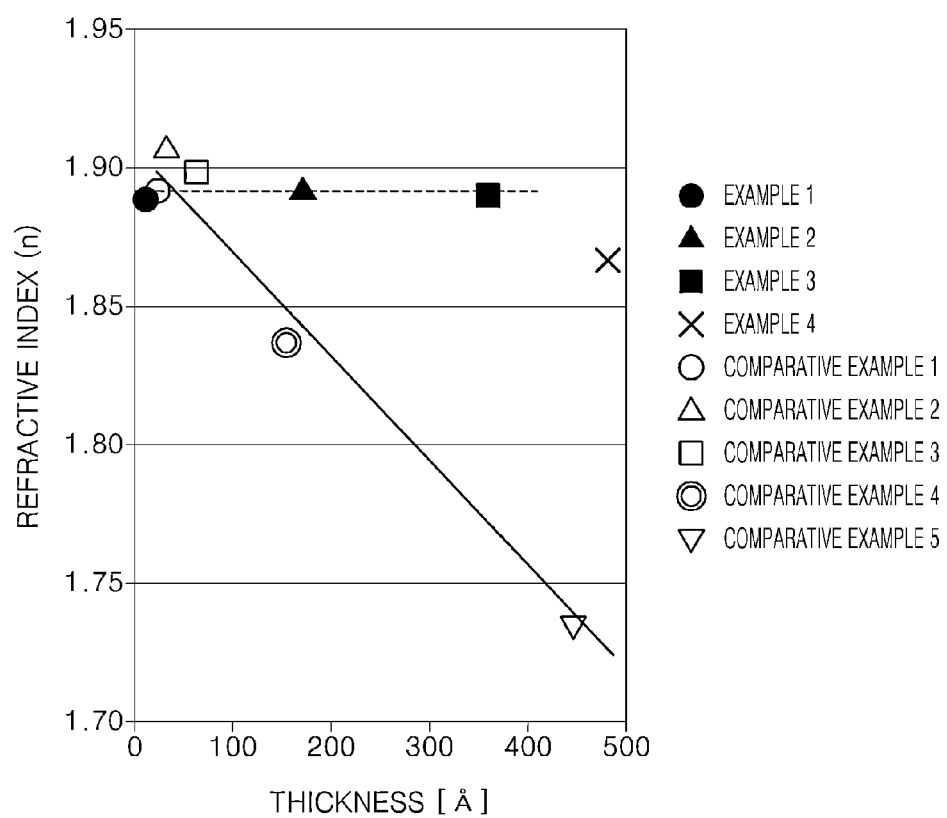
FIG. 4 illustrates a coordinate plane of thickness versus refractive index of thin films prepared according to Examples and Comparative Examples.

Referring to Table 4 and FIG. 4, the thin films of Examples 1 through 4 have a refractive index of 1.85 or greater even though they are relatively thick, while the refractive indexes of the thin films of Comparative Examples 1 through 5 decrease when the thin films become thick. From the results, it is confirmed that compact layers having various thicknesses may be prepared using the preparation method of the thin film described above, while relatively thick compact layers having a thickness of greater than 50 Å are not prepared using a general method of preparing a thin film even though thin compact layers having a thickness of 50 Å or less are prepared using the general preparation method.

Evaluation Example 2

Transmission Electron Microscopic (TEM) Images

Figure 5:
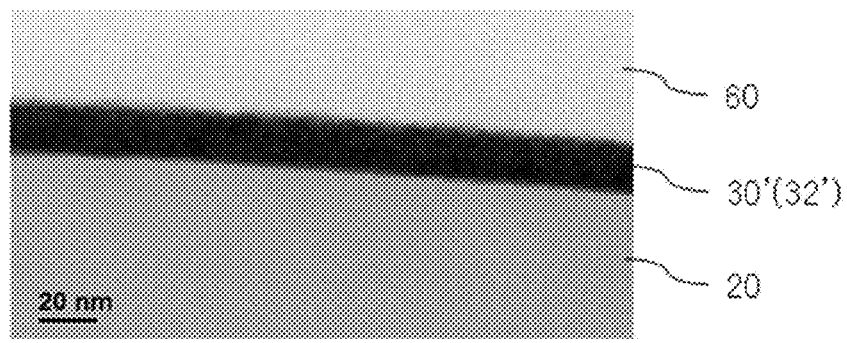
FIG. 5 is a transmission electron microscopic (TEM) image of a multi-layered structure including a thin film prepared according to Example 2.
Figure 6:
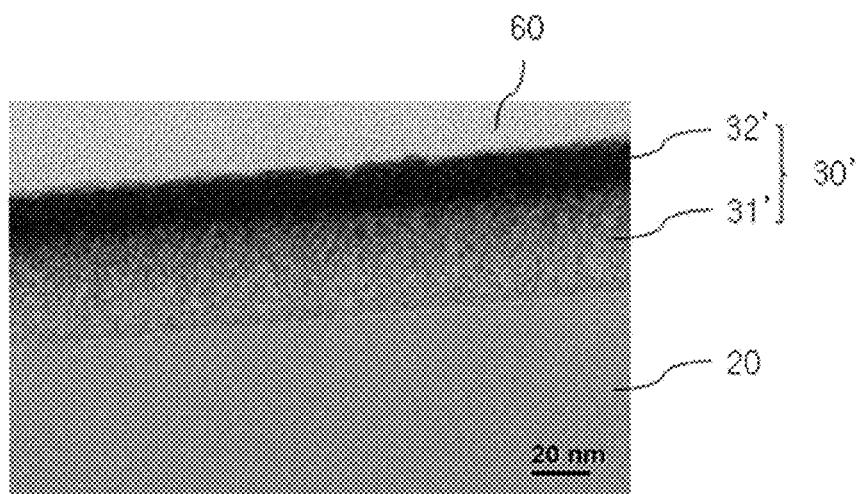
FIG. 6 is a TEM image of a multi-layered structure including a thin film prepared according to Example 4.
Figure 7:
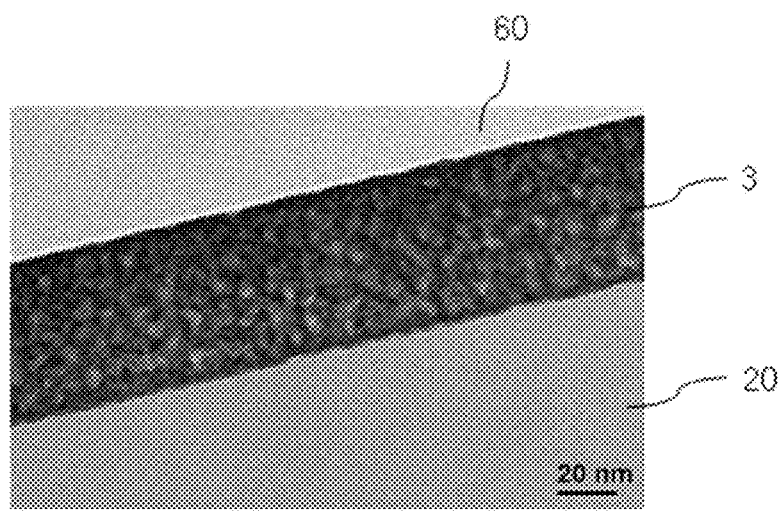
FIG. 7 is a TEM image of a multi-layered structure including a thin film prepared according to Comparative Example 5.

Cross-sectional images of the thin films of Example 2, Example 4, and Comparative Example 5 were taken using a transmission electron microscope (TEM), and the results are respectively illustrated in FIGS. 5 through 7.

Referring to FIG. 5, the thin film 30' of Example 2 has a single structure composed of only a compact layer 32'.

Referring to FIG. 6, the thin film 30' of Example 4 has a hetero-structure composed of a compact layer 32' having a thickness of about 200 Å and a porous layer 31' having a thickness of about 400 Å.

Referring to FIG. 7, the thin film 3 of Comparative Example 5 has a single structure composed of only a porous layer.

In FIGS. 5 through 7, reference numeral '20' indicates a glass substrate, and reference numeral '60' indicates an adhesive material (i.e., glue) attached to the thin film when a TEM image sample was prepared.

As described above, according to some example embodiments, there is provided a method of preparing a thin film by which the thickness of a thin film layer having a relatively high refractive index may be adjusted and that is performed at relatively low costs. In addition, there are provided a relatively thick compact layer, an apparatus for preparing a thin film by which compact layers having various thicknesses may be prepared, and an electronic device including the thin film.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. A method of preparing a thin film, comprising:
coating a thin film-forming composition on a substrate; and
heat-treating the coated thin film-forming composition under a pressure less than 760 Torr to form a hetero-structure thin film, the hetero-structure thin film including a first layer and a second layer on the first layer,
wherein the thin film-forming composition includes a solvent, wherein the first layer has a refractive index of less that 1.85 and is more porous than the second layer, and
wherein the method increases a thickness of the second layer having a refractive index in the range of about 1.85 to about 2.0 by increasing an evaporation rate of the solvent from the surface of the thin film-forming composition.

2. The method of claim 1, wherein the coating is performed by one of inkjet printing, spin coating, slit coating, spraying, immersion, a roll-to-roll method, and nanoimprinting.

3. The method of claim 1, wherein the heat-treating is performed at a pressure in a range of about $1 \times 10^{-6}$ Torr to less than 760 Torr and at a temperature in a range of about 250° C. to about 450° C.

4. The method of claim 1, wherein the thin film-forming composition further comprises a metal oxide precursor, and a sol stabilizer.

5. The method of claim 4, wherein the metal oxide precursor comprises at least two selected from the group consisting of a zinc compound, an indium compound, a hafnium compound, a gallium compound, a titanium compound, a zirconium compound, an aluminum compound, a silicon compound, a germanium compound, a tin compound, a magnesium compound, a yttrium compound, a vanadium compound, a lithium compound, a cerium compound, a calcium compound, a potassium compound, a scandium compound, a tantalum compound, a tungsten compound, a copper compound, a molybdenum compound, a ruthenium compound, an antimony compound, a tellurium compound, an iodine compound, an iridium compound, a lead compound, and a bismuth compound.

* * * * *